(12) United States Patent
Ng

(10) Patent No.: US 7,521,792 B2
(45) Date of Patent: Apr. 21, 2009

(54) SEMICONDUCTOR PACKAGE WITH HEAT SPREADER

(75) Inventor: Thian Moy Shirley Ng, Singapore (SG)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/588,340

(22) PCT Filed: Feb. 3, 2004

(86) PCT No.: PCT/IB2004/000272

§ 371 (c)(1),
(2), (4) Date: Mar. 26, 2007

(87) PCT Pub. No.: WO2005/086217

PCT Pub. Date: Sep. 15, 2005

(65) Prior Publication Data

US 2007/0216009 A1 Sep. 20, 2007

(51) Int. Cl.
*H01L 23/10* (2006.01)
*H01L 23/34* (2006.01)
(52) U.S. Cl. .................. 257/707; 257/706; 257/712; 257/713; 257/E23.088; 257/E23.101; 257/E23.102
(58) Field of Classification Search .................. 257/706, 257/707, 712, 713, E23.088, E23.101, E23.102
See application file for complete search history.

(56) References Cited

U.S. PATENT DOCUMENTS

| | | | |
|---|---|---|---|
| 5,471,366 | A | 11/1995 | Ozawa |
| 5,726,079 | A | 3/1998 | Johnson |
| 6,114,761 | A | 9/2000 | Mertol et al. |
| 6,239,486 | B1 | 5/2001 | Shimizu et al. |
| 6,259,154 | B1 | 7/2001 | Niwa |
| 6,444,498 | B1 | 9/2002 | Huang |
| 6,541,310 | B1 | 4/2003 | Lo et al. |
| 2001/0040005 | A1 | 11/2001 | Pompeo et al. |

FOREIGN PATENT DOCUMENTS

| | | |
|---|---|---|
| EP | 1172851 A2 | 1/2002 |
| WO | 0241394 | 5/2002 |
| WO | 03030256 | 4/2003 |

*Primary Examiner*—Ngan Ngo
(74) *Attorney, Agent, or Firm*—Dicke, Billig, Czaja PLLC

(57) ABSTRACT

A semiconductor package is disclosed. In one embodiment the package includes a semiconductor chip including an active surface with a plurality of chip contact areas and a package substrate including a plurality of first contact areas and a plurality of second contact areas on its bottom surface. The chip is mounted on the package substrate with its active surface facing the package substrate. A plurality of conducting means provide electrical contact between the chip contact areas and the first contact areas. A heat spreading means comprises a planar area and at least one protrusion. The planar area is attached to the upper surface of the chip and the protrusion is attached to the upper surface of the package substrate.

12 Claims, 4 Drawing Sheets

SEMICONDUCTOR PACKAGE WITH HEAT SPREADER

CROSS REFERENCE TO RELATED APPLICATION

This Utility Patent Application claims the benefit of the filing date of International Application No. PCT/IB2004/000272, filed Feb. 3, 2004, which is herein incorporated by reference.

BACKGROUND

The invention relates to a matrix-type semiconductor package having a heat spreader.

U.S. Pat. No. 6,541,310 discloses a method for fabricating an encapsulated semiconductor package which includes an embedded heat spreading frame.

U.S. Pat. No. 6,444,498 discloses a method for assembling an encapsulated semiconductor package which includes a heat spreading plate.

These methods are of including a heat spreader in an encapsulated package are complex and inconvenient.

For these and other reasons, there is a need for the present invention.

SUMMARY

The present invention provides a semiconductor package with a more efficient heat spreader and a simpler and more economic method of assembling a package including a heat spreader.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
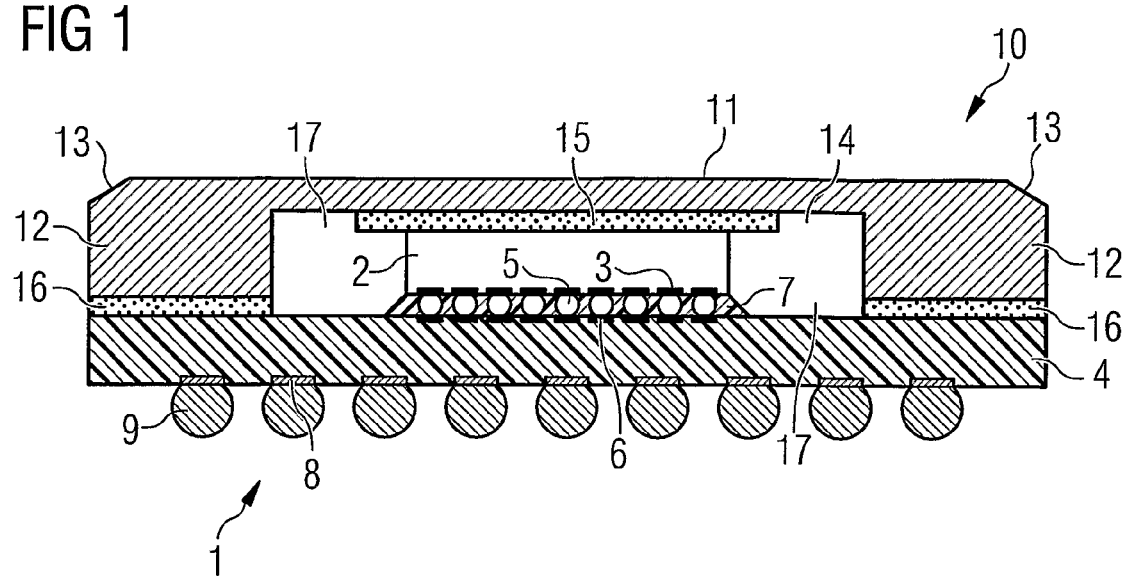
FIG. 1 illustrates a cross-sectional view of a semiconductor package assembled according to the method of the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a semiconductor package with a more efficient heat spreader and a simpler and more economic method of assembling a package including a heat spreader.

In one embodiment, the semiconductor package according to the invention includes a semiconductor chip which includes an active surface with a plurality of chip contact areas and a package substrate. The package substrate includes a plurality of first contact areas on its upper surface and a plurality of second contact areas on its bottom surface.

The chip is mounted on the package substrate with its active surface facing the package substrate. A plurality of conducting means provide electrical contact between the chip contact areas and the first contact areas of the package substrate. The conducting means preferably include solder balls or bumps, wire bonds or flexible tape. The space between the active surface of the chip and the package substrate is preferably underfilled with epoxy resin. The external contact means, such as solder balls, are connected to the second contact areas on the bottom of the package substrate to provide electrical contact from the package to, for example, an external circuit board.

The semiconductor package also includes a heat spreading means or heat spreader or heat dissipater or heat slug. The heat spreader includes a planar area, for example an essentially flat plate, and at least one protrusion, such as protruding bar. The planar area of the heat spreader is attached to the upper surface of the chip and the protrusion of the heat spreader is attached to the upper surface of the package substrate.

The heat spreader preferably includes a material of good thermal conductivity in order to improve heat removal or dissipation from the chip. Typical materials include metals such as copper or aluminum or their alloys. These have the additional advantage that they are relatively inexpensive and easy to process. Preferably, the surfaces of the heat spreader, including both those facing away from and towards the chip, are black in color. This again improves the efficiency of the heat dissipation from the package.

In one embodiment, the heat spreader includes two protrusions which are located on opposite sides of the chip. These protrusions are attached to the package substrate. This has the advantage that the heat spreader is mounted in a stable configuration and exerts less downwards force onto the chip. This leads to a higher reliability of the package as the delicate contacts between the chip and the package substrate are less likely to be damaged.

In one embodiment, the two protrusions are provided along the whole length of the two opposing sides of the package substrate. The protrusions or protruding bars preferably have an essentially square or rectangular cross-section. This increases the stability of the heat spreader. Additionally, the outer surface area of the heat spreader is increased which leads to improved heat dissipation from the package.

The heat spreader according to the invention is also laterally essentially the same size as the package substrate. This has the effect of maximizing the surface area of the heat spreader further increasing the efficiency of heat dissipation.

In one embodiment, the package includes two opposing sides which are open and not enclosed by the heat spreader. The package and chip are not encapsulated by epoxy resin or mould material. This has the advantage that the surfaces of the heat spreader are not covered, or partially covered, by mould material. Heat dissipation from the package is therefore advantageously improved and an additional step in the assembly process to remove mould material which has flashed onto the heat spreader during the moulding process is avoided. This has the further advantage that the assembly of the package is simplified and is, therefore, more economic.

The semiconductor package of the invention includes open-ended air tunnels which extend from one side to the opposing side of the package. The air tunnels are formed between the chip, the heat spreader and the package substrate. These air tunnels have the advantage that heat is more directly removed from the active surface of the chip, particularly as the chip is not completely encapsulated by mould material. More advantageously, a flow of air through the air tunnels is used to further facilitate heat removal from the package.

In one embodiment, the heat spreader is preferably attached to the upper surface of the semiconductor chip by adhesive means of high thermal conductivity. This advantageously improves the dissipation of heat from the chip. The heat spreader is attached to the package substrate by non-conductive adhesive means. This advantageously prevents shorting between any conductor tracks or contact areas on the upper surface of the package substrate and the heat spreader.

The adhesive means includes any adhesive known in the art. For example, the adhesive means includes a fluid adhesive such as epoxy. This has the advantage that any slight differences in height are compensated for when the heat spreader is attached to the chip and package substrate. Alternatively, the adhesive means includes adhesive tape. This has the advantage that the adhesive will not spread onto the surrounding areas during the attaching process but remain in the area on which it was originally placed.

The heat spreader according to the invention is advantageously used for any semiconductor package in which the active surface of the chip faces the package substrate, such as Ball-Grid Array or laminate package or Thin and Fine Ball-Grid Array type packages or Multi-Chip Modules. The package substrate includes, for example, a redistribution board. Preferably, the chip is mounted to the redistribution board using the flip-chip technique.

The invention also relates to methods of assembling a semiconductor package which includes a heat spreader.

In one embodiment, a method includes the following process. Firstly a matrix-sized or module heat spreading or dissipating means or heat slug or matrix-sized heat spreading module is provided.

The heat spreading module includes a plurality of sawing grooves on its upper surface. In one embodiment the sawing groves are V-shaped and include two orthogonal sets of parallel spaced grooves, one set arranged laterally and the other set arranged longitudinally forming a regular array, such as a square grid array. The spacing between the sawing grooves is approximately the same as that of the desired package size. In one embodiment, the sawing grooves extend to the outer edges of the upper surface and through the side walls of the matrix-sized heat spreading module. This enables the position of the saw blade to be guided from the outer edge during the singulation process.

The matrix sized heat spreading module further includes a plurality of grooves in its bottom surface. In one embodiment, these grooves have a rectangular cross-section and are laterally positioned between one set of the sawing grooves on the upper surface of the matrix-sized heat spreader. The bottom surface of the matrix-sized heat spreading module includes protrusions which preferably have a rectangular or square cross-section. These protrusions extend from one side to the opposite side of the matrix-sized heat spreader and are regularly spaced. The spacing between the protrusions is chosen so that when it is mounted on the substrate including a plurality of package sites the chip is located within the groove in the bottom surface and the protrusions make contact with the substrate between the rows of chips. One of the sets of V-shaped sawing grooves in the upper surface of the heat spreading module is located in the edge of the upper surface and is positioned essentially in the lateral centre of the protrusions.

In the next step of the process, thermally conductive adhesive means is attached to the laterally flat surface of the grooves and non-conductive adhesive means is attached to the protrusions of the bottom surface of the matrix-sized heat spreading module.

A substrate or matrix package substrate or carrier chip module is provided which includes a matrix of package sites arranged in an array. Each package site includes a semiconductor chip mounted on a package substrate such as a redistribution board. The matrix sized heat spreading module is then positioned on the substrate so that the upper surface of the grooves in the bottom surface of the heat spreading module are positioned on the upper passive surface of the chip and the protrusions are positioned on the package substrates of the substrate between the rows of chips. The adhesive means is then cured by an appropriate curing treatment, such as by heating in an oven.

A plurality of external contact means, such as solder balls, are then attached to the external contact areas located on the bottom surfaces of the plurality of package substrates of the substrate. The individual semiconductor packages are then singulated or split or separated by using the sawing grooves in the upper surface of the heat spreading module to guide the path of the saw blade.

In one embodiment the chips are mounted in rows and columns in a regular array, such as a square grid array. The spacing and arrangement of the chips on the matrix substrate typically depends on the desired type of chip, mounting method and type of package.

In one embodiment, the plurality of chips are mounted at each package site of the substrate to a redistribution board using the flip-chip technique. The area between each chip and its redistribution board is advantageously filled with epoxy resin. This protects the delicate contacts between the chip and the redistribution board.

The matrix-sized heat spreader of the invention is suitable for use in a variety of different types of semiconductor package without necessarily changing the dimensions of the heat spreader, if, for example, the matrix of package sites on the substrate is similar and the chip thickness and bump size is essentially the same and the chip fits laterally within the groove. Manufacturing costs and the assembly process are, therefore, further simplified.

Additionally, the heat spreader of the invention is suitable for use in multi-chip modules where a plurality of chips are arranged laterally. In this embodiment, the planar area or flat plate of the heat spreader is preferably attached to a plurality of chips of the multi-chip module.

Advantageously, the invention relates to a method of mounting a matrix-sized heat spreader or heat spreading module or heat slug to a plurality of semiconductor chips mounted on a matrix package or chip carrier or matrix substrate.

The mounting of the matrix-sized heat spreading module on a plurality of chips in a batch-type manner has the advantage that the assembly process is much simpler, faster, and therefore more efficient and economic. The method of the invention has the advantage that a pre-defined matrix-type substrate including the chips may be fabricated using the existing assembling line in the factory. This means that the method according to the invention provides further advantages as an entirely new assembly line is not required.

The direct attachment of the heat spreader to the chip by adhesive with a high thermal conductivity provides an efficient path for the heat transfer from the chip to the heat spreading means. The heat spreader acts as a shelter for the chip so that a moulding process is not necessarily required, reducing the material costs as well as the process cycle time.

Advantageously, the heat is not only transferred through any mould or encapsulation material reducing the heat transfer path. The surface area of the heat spreader which is exposed to the atmosphere is large, as both the upper surface and side walls of the heat spreader form the outer surface of the semiconductor package. This has the advantage that heat is more efficiently dissipated from the package and the Junction-to-Ambience thermal resistance of the package is lowered. The two open sides of the heat spreader therefore form two open sides to the package. Air is able to flow through the package further improving the heat dissipation from the package. Thus the thermal management and the reliability of the package is improved.

An embodiment of the invention will now be described by way of example with reference to the drawings.

FIG. 1 illustrates a flip-chip semiconductor package 1 assembled according to the invention. The package includes a semiconductor chip 2 mounted by the flip-chip technique to a re-distribution board 4 and a heat spreader 10 which is attached to the upper passive surface of the semiconductor chip 2 and to the upper surface of the re-distribution board 4. The re-distribution board 4 and heat spreader 10 laterally larger than the semiconductor chip 2 and have approximately the same lateral size.

The semiconductor chip 2 includes a plurality of chip contact areas 3 on its active surface and the re-distribution board 4 includes a plurality of contact areas 6 on its upper surface. The semiconductor chip 2 is mounted with its active surface facing the a re-distribution board 4 by microscopic solder balls 5 which provide the electrical contact between the contact areas 3 on the chip 2 and contact areas 6 on the re-distribution board 4. Microscopic is used in this context to describe that the solder balls which are seen with the aid of a light microscope. This type of mounting of the chip 2 to a re-distribution board 4 is commonly known as the flip-chip technique.

The space between the active surface of the chip 2 and the upper surface of the re-distribution board 4 is filled with an insulating epoxy resin 7 so that all of the microscopic solder balls 5 are covered with the resin 7. The re-distribution board 4 also includes conducting tracks on its upper surface and conducting tracks and vias within its thickness (not shown in the figure) which connect the contact areas 6 on its upper surface to the external contact areas 8 on its bottom surface. Macroscopic solder balls 9 are connected to these external contact areas 8 and they provide the electrical connection from the package 1 to an external printed circuit board, which is not shown in the Figure for clarity. Macroscopic is used in this context to describe that the solder balls are visible to the naked eye.

The semiconductor package 1 also includes a heat slug or heat spreading or heat dissipating means or heat spreader 10. The heat spreader 10 includes a laterally essentially square flat plate 11 which includes two protruding bars 12 which have an essentially rectangular cross-section. The outer vertical surface of each protruding bar 12 is roughly vertically aligned with the outer side surface of the flat plate 11 so that a longitudinal groove 14 with an essentially rectangular cross-section is formed in the lateral centre of the heat spreader 10. The longitudinal groove 14 is more clearly seen in the perspective views of FIGS. 2 and 3. The lateral distance between the inner vertical walls of the protruding bars 12 is larger than that of the chip 2 and the height of the groove is slightly larger than the distance of the upper passive surface of the mounted chip 2 above the upper surface of the re-distribution board 4.

The upper outer edges of the heat spreader 10 have a chamfered edge 13 which is a result of the package singulation process which is described later and illustrated in FIG. 5. The heat spreader 10 is laterally essentially the same size as the re-distribution board 4 of the package 1.

The heat spreader 10 is attached in its centre by the inner upper surface formed by the groove 14 to the passive upper surface of the chip 2 by means of thermally conducting adhesive 15. The width of the thermally conducting adhesive 15 is slightly greater than the width of the chip but narrower than the width of the groove. The heat spreader 10 is also connected by the bottom surface of the protruding bars 12 to the upper surface of the re-distribution board 4 by non-conductive adhesive 16.

The heat spreader 10 is connected to the re-distribution board 4 on only 2 sides of the package 1 by the protruding bars 12. This is more clearly illustrated in the perspective views of FIGS. 2 and 3. The heat spreader 10 is laterally essentially the same size as the redistribution board 4 of the package. Therefore, the protruding bars 12 are attached to the redistribution board 4 from the front side to the back side of the redistribution board 4 and the package 1 as it is seen in FIG. 1. The spaces 17 formed between the inner vertical walls of the protruding bars 12 of the heat spreader 10 and the chip 2 therefore form open-ended tunnels 17 from the front side to the back side of the package 1. The front and back side walls of the heat spreader 10 and therefore the package 1 are therefore open and the left and right side walls are solid.

Figure 2:
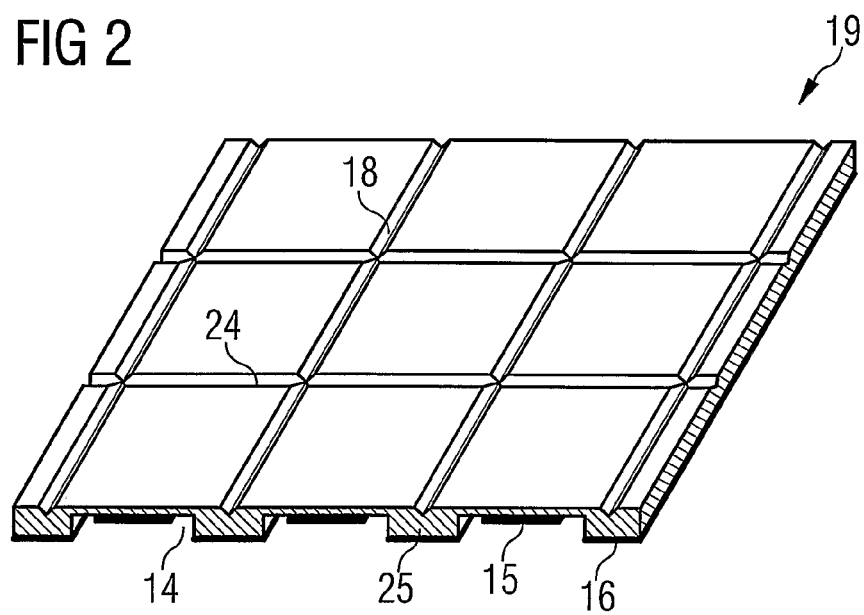
FIG. 2 illustrates a perspective top view of a matrix-sized heat spreading module according to the invention.

FIG. 2 illustrates a perspective view of the matrix-sized heat spreader 19. The matrix-sized heat spreading module 19 is attached to a substrate 20 including a plurality of flip-chip mounted semiconductor chips arranged in a matrix grid array in the method of the invention illustrated in FIGS. 3 to 5.

FIG. 2 illustrates that the matrix-sized heat spreading module 19 includes an approximately square metal sheet 23 which includes 2 sets of V-shaped sawing grooves 18 and 24 in its upper surface. One set of 3 parallel grooves 24 are positioned laterally, the second set of 4 parallel grooves 18 are positioned longitudinally with respect to the outer dimensions of the metal sheet 23. The sawing grooves 18 and 24 are arranged to form a square grid pattern in the upper surface of the metal sheet 23 and approximately correspond to the 3 by 3 matrix of package sites 21 of the substrate 20. The spacing of the grooves 18 and 24 approximately corresponds to the outer dimensions of the semiconductor package 1. The sawing grooves 18 and 24 extend across the upper surface and through the side walls of the heat spreading module 19.

The metal sheet 23 of the matrix-sized heat spreading module 19 also includes three grooves 14 of a laterally rectangular cross-section located in its bottom surface. These grooves 14 are positioned essentially parallel to each other and in the longitudinal direction of the metal sheet 23. The grooves 14 are laterally positioned so that they lie approximately centrally between the V-shaped grooves 18 on the opposite surface of the metal sheet 23 of the matrix-sized heat spreading module 19. The bottom surface of the metal sheet 23 therefore includes four protruding bars 25 of approximately rectangular cross-section. The V-shaped grooves 18 are therefore located in the edge of the upper surface of the matrix-sized heat spreading module 19 and are located in approximately the lateral centre of the four protruding bars 25.

Figure 3:
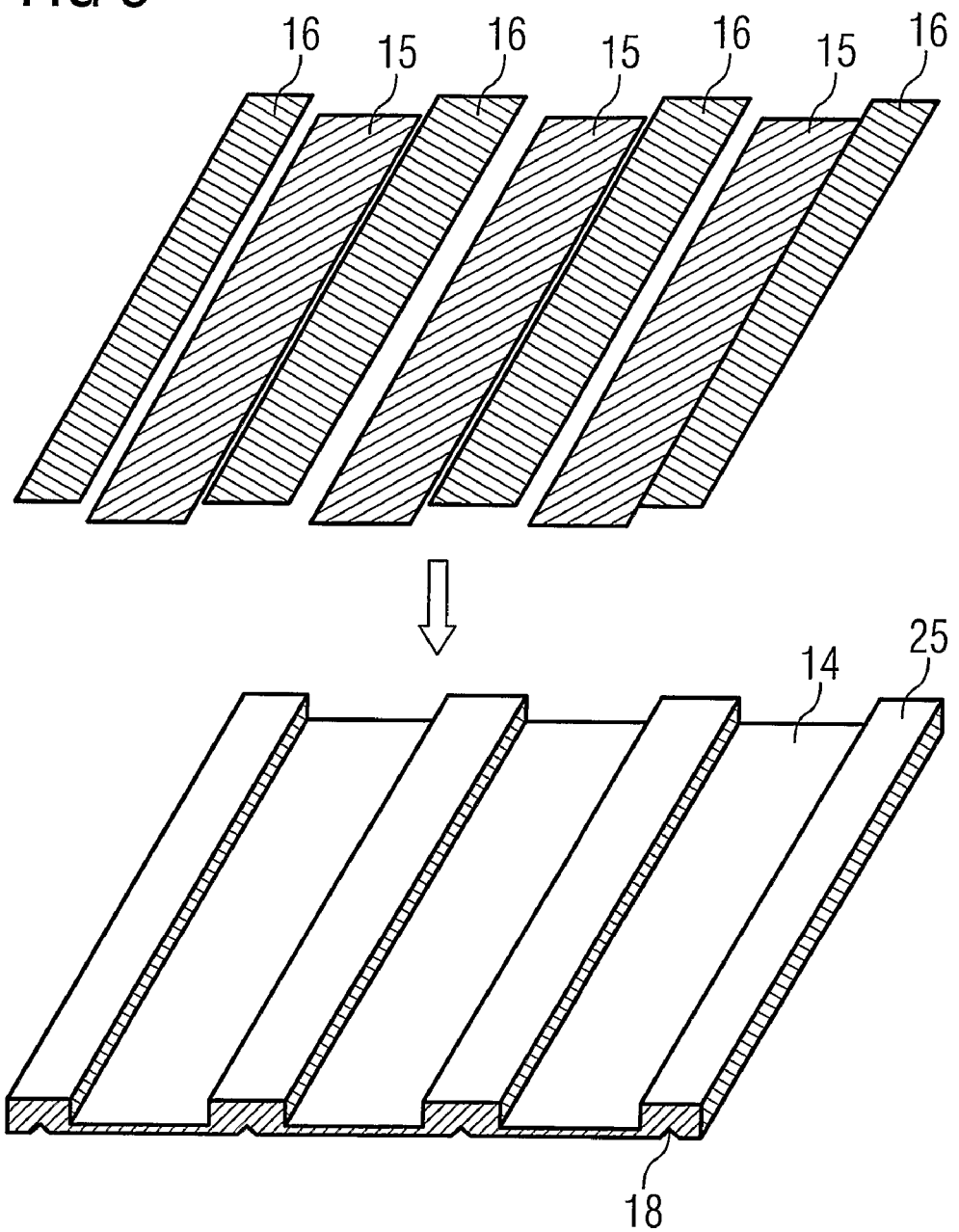
FIG. 3 illustrates the attachment of adhesive to the bottom surface of matrix-sized heat spreading module of FIG. 2.

FIG. 3 illustrates the attachment of the adhesive to the matrix-sized heat spreading module 19 in the first step of the method to form the package 1 according to the invention. An adhesive 15 with particularly good thermal conduction properties is attached to the lateral surface of the each groove 14. An electrically non-conducting adhesive 16 is attached to the lateral surface of the longitudinal protruding bars 25.

Figure 4:
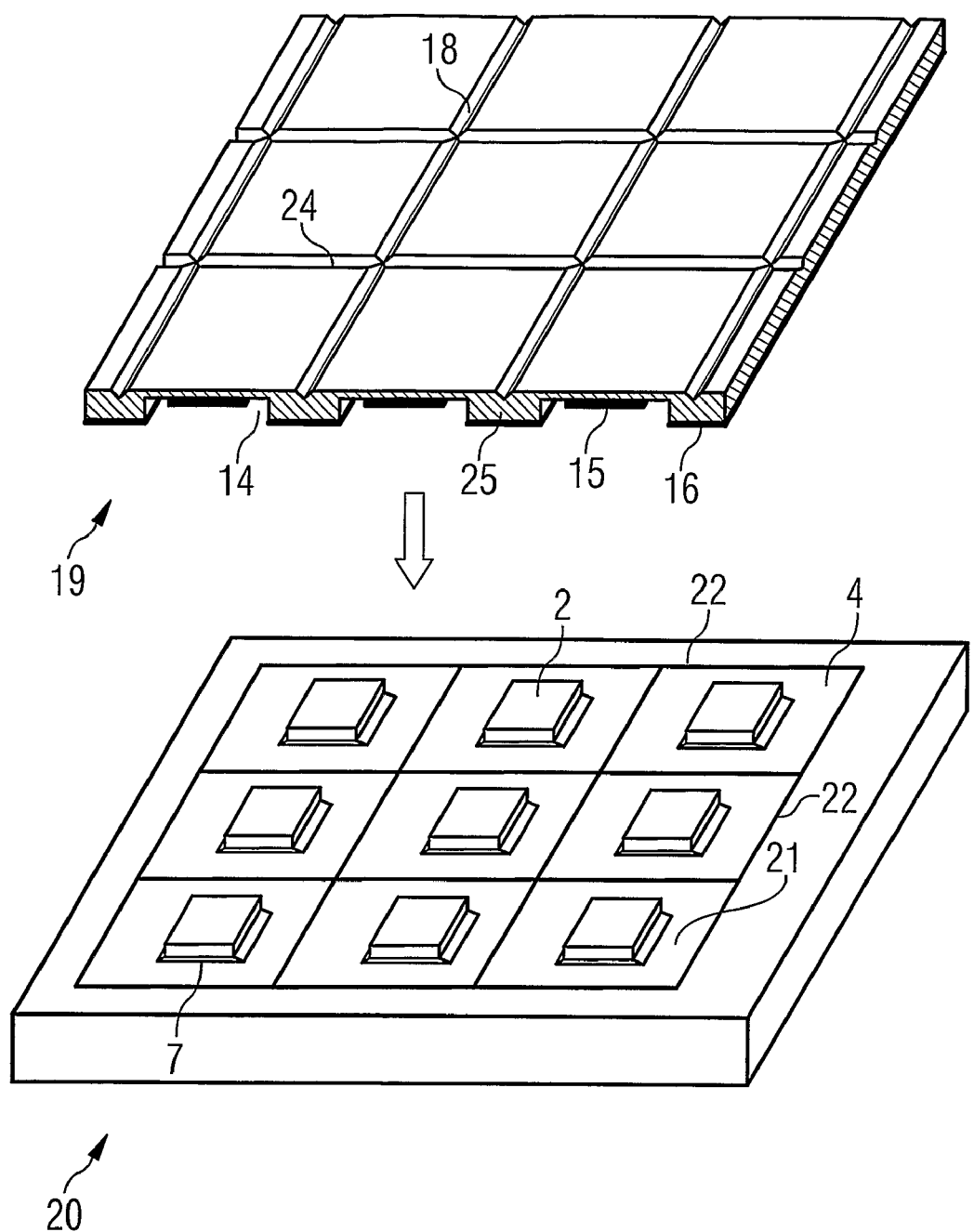
FIG. 4 illustrates the attachment of the matrix-sized heat spreading module of FIG. 3 to a substrate containing a plurality of semiconductor chips arranged in a matrix grid array.

FIG. 4 illustrates the substrate 20 which includes package sites 21 for nine semiconductor chips 2 arranged in a 3 by 3 matrix grid array. The chips 2 and package sites 21 are arranged in rows and columns. The area of each package site 21 is denoted by demarcation lines 22 arranged in a square grid array whose dimensions and orientation are approximately the same as the square grid array formed by the V-shaped grooves 18 and 24 of the matrix-sized heat spreader 19. The substrate 20 includes a semiconductor chip 2 mounted in the centre of each package site 21 using a known flip-chip technique for matrix-sized substrates or carrier chip modules.

Referring to FIG. 1 and FIG. 4, each chip 2 is therefore mounted by means of a plurality of microscopic solder balls 5 between the contact areas 3 of the chip 2 and contact areas 6 of a re-distribution board 4. The area between each chip 2 and the distribution board 4 of each package site 21 is underfilled by epoxy resin 7 so that the space between the active surface of the chip 2 and the microscopic balls 5 are covered by epoxy resin 7. The epoxy 7 is then cured by heating in an oven.

The matrix-sized heat spreading module 19 is then mounted on the substrate 20 which includes the matrix of chips 2 mounted in the package sites 21. The matrix-sized heat spreading module 19 is positioned so that the protruding bars 25 are positioned approximately centrally between the rows of mounted chips so that the longitudinal V-shaped grooves 18 and 24 in the upper surface of the heat spreading module 19 are located approximately above the package demarcation lines 22 of the substrate 20.

In this orientation, the thermally conductive adhesive 15 is attached to the upper passive surface of the chips 2 and the insulating adhesive 16 is attached to the upper surface of the re-distribution board 4. The adhesives are then cured so provide a secure connection between the matrix-sized heat spreading module 19 and the chips 2 and redistribution boards 4 of the substrate 20. The solder balls 9 are then attached to the external contact areas 8 on the bottom side of the re-distribution board 4 of each package site 21.

Figure 5:
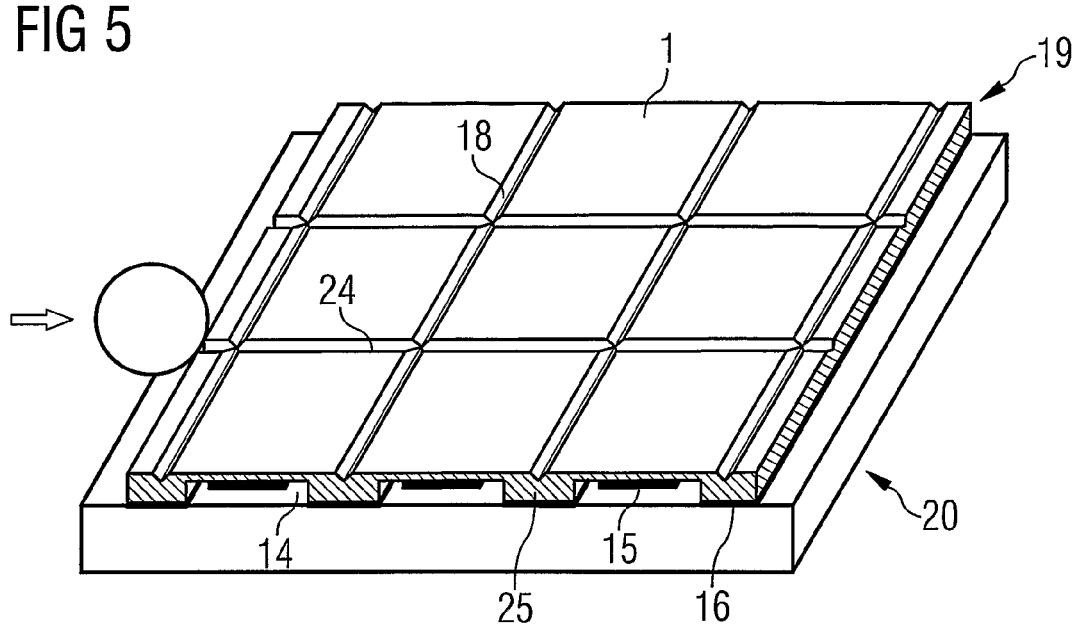
FIG. 5 illustrates the singulation of the matrix-sized package of FIG. 4 to form a plurality of the semiconductor packages of FIG. 1.

FIG. 5 illustrates the singulation of the individual packages 1 from the matrix package formed by the matrix-sized heat spreading module 19 and the substrate 20 containing nine packages 1 arranged in a 3 by 3 array. The V-shaped groves 18 and 24 in the matrix-sized heat spreading module 19 provide a guide for the saw blade.

The semiconductor packages 1 are then be tested and packaged for transportation to the customer. The semiconductor packages 1 are be mounted on an external printed circuit board.

REFERENCE NUMBERS 1 semiconductor package
2 semiconductor chip
3 contact areas on chip
4 re-distribution board
5 microscopic solder balls
6 contact areas on re-distribution board
7 epoxy
8 external contact areas
9 macroscopic solder balls
10 heat spreader
11 flat plate of heat spreader
12 protruding bar of heat spreader
13 chamfered edge
14 groove
15 thermally conductive adhesive
16 non-conducting adhesive
17 open ended tunnels
18 longitudinal V-shaped sawing groove
19 matrix-sized heat spreading module
20 substrate
21 package site
22 package demarcation lines
23 rectangular metal sheet
24 lateral V-shaped sawing groove
25 protruding bar of matrix-sized heat spreading module 19

The invention claimed is:

1. A matrix package comprising:
   a heat spreading module comprising:
      a plurality of sawing guide grooves on an upper surface; and
      a plurality of grooves and protrusions on a bottom surface; and
      a thermally conductive adhesive applied to an inside surface of the grooves and a non-conductive adhesive applied to a surface of the protrusions of the heat spreading module; and
   a substrate comprising a matrix of package sites arranged in an array each including a chip and a package substrate,
   wherein the heat spreading module is positioned on the substrate so that the surface of the protrusions are in contact with the package substrates of the package sites and the inside surfaces of the grooves are connected to an upper passive surface of the chips.

2. The matrix package of claim 1, wherein the plurality of protrusions are positioned approximately centrally between rows of chips.

3. The matrix package of claim 1, wherein the plurality of grooves are positioned approximately parallel to each other.

4. The matrix package of claim 1, wherein the plurality of sawing grooves are arranged in a square grid array.

5. The matrix package of claim 1, wherein the package sites are arranged in a square grid array.

6. The matrix package of claim 4, wherein the sawing guide grooves are arranged in a square grid array which has approximately the same dimensions and orientation as the square grid array of the package sites.

7. The matrix package of claim 1, wherein the chips are mounted on the package sites using a flip-chip technique.

8. A semiconductor assembly comprising:
a substrate having a matrix grid array of package sites defined along lateral grid array lines and longitudinal grid array lines, each package site having a semiconductor chip substantially centered within the package site and mounted in a flip-chip fahsion to the substrate; and
a heat spreader module including:
   a planar plate having upper and lower surfaces and lateral and longitudinal dimensions substantially equal to the substrate; and
   a plurality of bar-like protrusions extending from the lower surface of the planar plate and extending across the longitudinal dimension of the planar plate, the bar-like protrusions being in parallel with one another and forming channel therebetween, the channels having a surface formed by the lower surface of the planar plate; and
   a grid-work of lateral and longitudinal sawing guide grooves extending across the upper surface of the planar plate, the longitudinal sawing guide grooves centrally aligned with the bar-like protrusions, wherein bar-like protrusions are bonded to the substrate along the longitudinal grid array lines with a thermally conductive adhesive and the surfaces of the channels are bonded to upper surfaces of the semiconductor chips with a electrically non-conductive adhesive.

9. The semiconductor assembly of claim 8, wherein the lateral sawing guide grooves align with the lateral grid array lines.

10. The semiconductor assembly of claim 8, wherein the lateral sawing guide grooves are V-shaped.

11. A heat spreader module comprising:
a plurality of bar-like protrusions extending from and running in parallel with one another across a longitudinal dimension of a planar lower surface and forming a plurality of channels therebetween, the channels having a surface formed by the lower planar surface; and
a grid of saw guide grooves extending across lateral and longitudinal dimension of a planar upper surface, wherein the heat spreader module is configured to be adhesively bonded to a substrate having an array of package sites having boundaries defined by lateral and longitudinal grid lines, each package site having a semiconductor chip substantially centered within the package site, wherein the bar-like protrusions are spaced so as to be bonded to the substrate along the longitudinal grid lines and the surfaces of the channels are configured to be bonded to an upper surface of the semiconductor chips, and the lateral and longitudinal saw guide grooves are spaced so as to align with the lateral and longitudinal grid lines.

12. The heat spreader module of claim 11, wherein a surface of the bar-like protrusions to be bonded to the substrate are coated with a thermally conductive adhesive and the surfaces of the channels are bonded to upper surfaces of the semiconductor chips with a electrically non-conductive adhesive.

* * * * *